Figure 1:
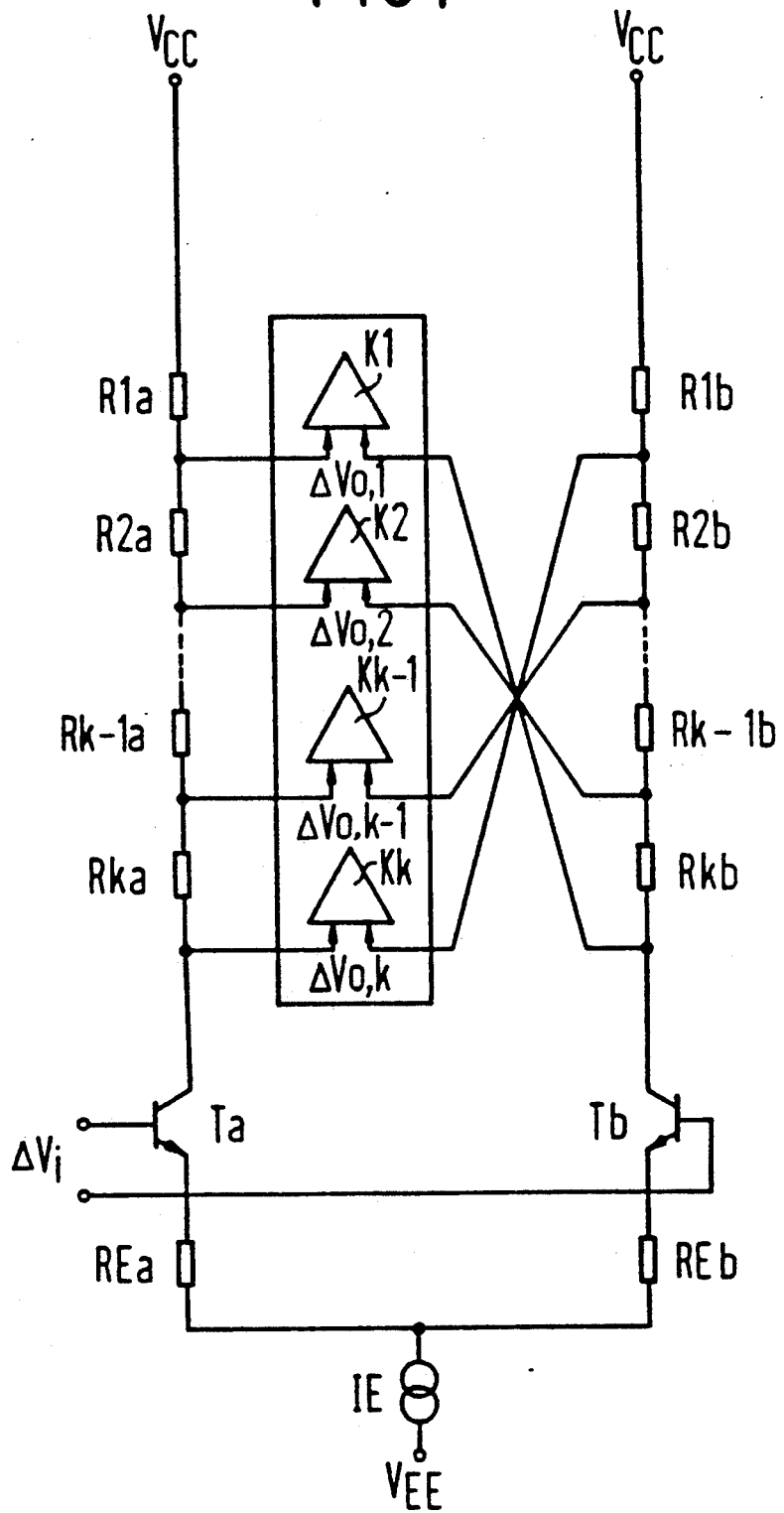

United States Patent [19]

Jessner et al.

[11] Patent Number: 5,204,679

[45] Date of Patent: Apr. 20, 1993

[54] DIFFERENTIAL ANALOG-DIGITAL CONVERTER

[75] Inventors: Hermann Jessner; Bernhard Zojer, both of Villach; Berthold Astegher, Klagenfurt, all of Austria

[73] Assignee: Siemens Aktiengesellschaft, Munich, Fed. Rep. of Germany

[21] Appl. No.: 929,974

[22] Filed: Aug. 14, 1992

[30] Foreign Application Priority Data

Feb. 14, 1990 [DE] Fed. Rep. of Germany ....... 4004546

Related U.S. Application Data

[63] Continuation-in-part of PCT/DE91/00116 Feb. 14, 1991

[51] Int. Cl.$^5$ .............................................. H03M 1/36
[52] U.S. Cl. ...................................... 341/159; 341/155
[58] Field of Search ................. 341/155, 156, 158, 159

[56] References Cited

U.S. PATENT DOCUMENTS

| | | | |
|---|---|---|---|
| 2,612,550 | 9/1952 | Jacobi . | |
| 3,594,766 | 7/1971 | Gilbert | 341/159 |
| 4,229,729 | 10/1980 | Devendorf et al. . | |
| 4,275,386 | 6/1981 | Michel et al. | 341/159 |
| 4,716,397 | 12/1987 | Werba et al. . | |
| 4,831,379 | 5/1989 | Van de Plassche | 341/156 |
| 4,839,653 | 6/1989 | Devito | 341/159 X |
| 4,897,656 | 1/1990 | Van de Plassche et al. | 341/156 |
| 4,912,469 | 3/1990 | Van de Grift et al. | 341/159 |
| 5,051,746 | 9/1991 | Van de Grift et al. | 341/159 |

FOREIGN PATENT DOCUMENTS

0155702 9/1985 European Pat. Off. .

OTHER PUBLICATIONS

Bulletin Schweizerscher, Elektrotechnischen Vereins vol. 51, No. 20, Oct. 8, 1960 (Neu) pp. 978-386.

Siemens 1989/90 Databook, pp. 369-386, "ICs fur Industrielle Anwendungen".

*Primary Examiner*—Howard L. Williams

[57] ABSTRACT

An analog-digital converter includes a differential amplifier having collector resistances each being in the form of a resistance line. Node points between resistance segments of the resistance lines are in the form of output terminals. Comparators with a balanced input are provided in the same amount as the resistance segments. In each case one input of a comparator is connected to an output terminal of a first resistance line and another input of the comparator is connected to an output terminal of a second resistance line. Therefore, the same resistance value in each case acts between two output terminals, which are connected to one comparator, in the collector circuit of the differential amplifier.

6 Claims, 3 Drawing Sheets

DIFFERENTIAL ANALOG-DIGITAL CONVERTER

CROSS-REFERENCE TO RELATED APPLICATION:

This application is a Continuation of International Application No. PCT/DE91/00116, filed Feb. 14, 1991.

The invention relates to an analog-digital converter, including a reference voltage generator having a series circuit of resistors, comparators each preparing an output signal as a function of an associated reference voltage and of an analog signal to be converted, and an evaluation circuit.

An analog-digital converter (A/D converter) is disclosed in the 1989/90 Data Book of the firm Siemens entitled "ICs für Industrielle Anwendungen" [ICs for Industrial Applications], pages 369 to 385, especially in a block diagram on page 375. In that case, a so-called "resistance line", which is formed from a series circuit preferably having 65 resistors, is connected between a positive and a negative reference potential. Each of 64 node points of such a series circuit is respectively connected to one of two inputs of a comparator, and the other inputs of the 64 comparators are connected jointly to an input terminal and receive the analog signal to be converted. In that case, each of the comparators is driven by means of a signal which is formed from the difference between the analog signal level and the respective reference level. The analog signal level is the same for all of the comparators, and the reference level differs for all of the comparators. An evaluation stage, including flip-flops, coders, demultiplexers and output stages, is connected downstream of the conversion stage or decision stage which is implemented by means of the comparators.

As in the case of any differential amplifier, the input capacitance of a comparator is heavily dependent on the differential voltage at its input and can become very large in the case of small differential voltages. In circuit configurations such as those described above, the input capacitances of all of the comparators are connected in parallel to the input terminal, with a number of comparators always being driven with a low differential signal at every analog signal level. Such known circuit configurations are thus distinguished by a large input capacitance, which is additionally dependent on the analog signal level. That relationship is shown graphically on page 385 of the above-mentioned Data Book.

The analog signal source is thus loaded in a highly capacitive manner, so that the accuracy of the A/D converter is adversely affected as a function of the impedance of the analog signal source and of the frequency of the analog signal to be converted.

The reference levels of the individual comparators are derived directly from the reference voltage because of the corresponding connection of the resistance line, and the A/D conversion result of such circuits is also heavily dependent on reference voltage interference because of the unbalanced driving of the comparators with respect to the reference potential drive and to the analog signal drive. In other words, such circuits are sensitive to differential interference.

An amplifier, which is connected between the analog signal source and the comparator signal inputs and could be used as an impedance converter, is not advisable in the case of such known circuits since the linearity errors associated therewith would have a noticeably interfering effect and the accuracy of the A/D converter would become considerably worse.

It is accordingly an object of the invention to provide a differential analog-digital converter, which overcomes the hereinafore-mentioned disadvantages of the heretofore-known devices of this general type, which has an input impedance having less dependence on the analog signal level, and which in addition loads the analog signal source less severely, has a lower sensitivity to DC interference and allows the comparators to be driven in a balanced manner.

With the foregoing and other objects in view there is provided, in accordance with the invention, an analog-digital converter, comprising an evaluation circuit, first and second reference voltage generators each including a series circuit of resistors, each of the reference voltage generators having a circuit node for preparing a lowest reference level, a circuit node for preparing a highest reference level, a circuit node for preparing a second lowest reference level, and a circuit node for preparing a second highest reference level, first, second, at least one further and last comparators each preparing an output signal as a function of an associated reference voltage and of an analog signal to be converted, the comparators each having two mutually balanced or symmetrical inputs, one input of the first comparator being connected to the circuit node of the second reference voltage generator for preparing the lowest reference level, and the other input of the first comparator being connected to the circuit node of the first reference voltage generator for preparing the highest reference level, one input of the second comparator being connected to the circuit node of the second reference voltage generator for preparing the second lowest reference level, and the other input of the second comparator being connected to the circuit node of the first reference voltage generator for preparing the second highest reference level, one input of the at least one further comparator being connected to the circuit node of the second reference voltage generator for preparing the second highest reference level, and the other input of the at least one further comparator being connected to the circuit node of the first reference voltage generator for preparing the second lowest reference level, one input of the last comparator being connected to the circuit node of the second reference voltage generator for preparing the highest reference level, and the other input of the last comparator being connected to the circuit node of the first reference voltage generator for preparing the lowest reference level, whereby the circuit nodes of the first and second reference voltage generators are unambiguously allocated to specific inputs of the comparators, a differential amplifier circuit having first and second transistors with control inputs, collector terminals and collector circuits, the first reference voltage generator being connected in the collector circuit of the first transistor, and the second reference voltage generator being connected in the collector circuit of the second transistor, the series circuit of resistors of the first reference voltage generator having one terminal connected to the collector terminal of the first transistor and another terminal connected to a first supply potential, and the series circuit of resistors of the second reference voltage generator having one terminal connected to the collector terminal of the second transistor and another terminal connected to the first supply potential, and the control input of the first transistor and the control input of the second transistor forming a balanced or symmetrical signal input to which push-pull signals are to be applied.

In accordance with another feature of the invention, the first and second reference voltage generators each have a linearization resistor connecting a respective one of the series circuits of reference resistors to the first supply potential.

In accordance with a further feature of the invention, there are provided third and fourth transistors each having a control path and each having a control input for receiving a constant potential, the first reference voltage generator being connected through the control path of the third transistor to the first supply potential, and the second voltage generator being connected through the control path of the fourth transistor to the first supply potential.

In accordance with a concomitant feature of the invention, the first and second transistors have emitter terminals, and there is provided another series circuit connected between the emitter terminals of the first and second transistors, the other series circuit having two emitter resistors and another circuit node therebetween, a first current source connected between the other circuit node and a second supply potential, and the emitter resistors having values selected as a function of the number and the value of the resistors of the series circuits of the reference voltage generators and of the value of the linearization resistors, for setting a gain factor of unity.

Other features which are considered as characteristic for the invention are set forth in the appended claims.

Although the invention is illustrated and described herein as embodied in a differential analog-digital converter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 2:
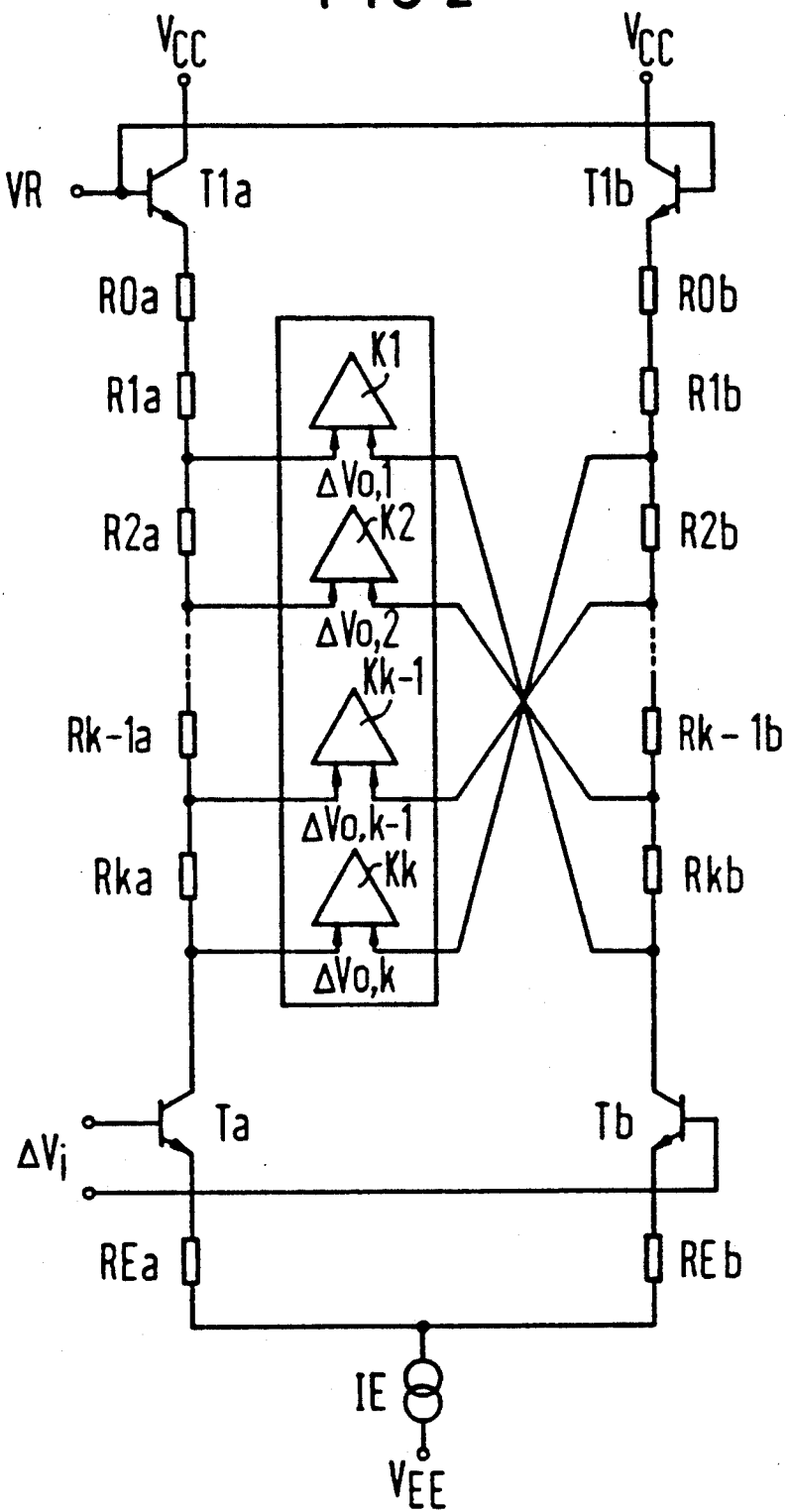
Figure 3:
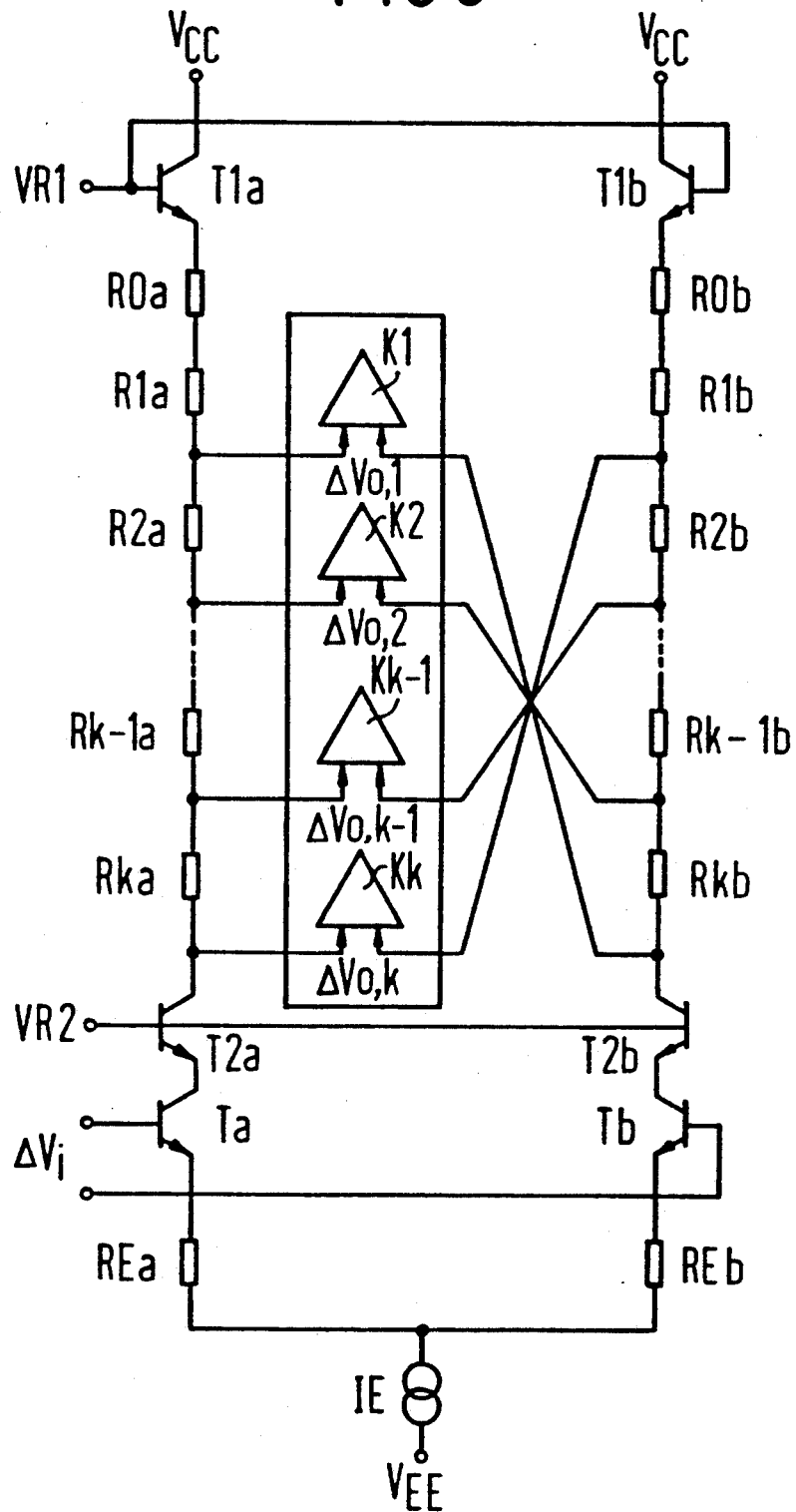

FIG. 1 is a schematic circuit diagram of an input circuit of an A/D converter according to the invention;

FIG. 2 is a circuit diagram similar to FIG. 1, having an additional cascode stage formed of third and fourth transistors T1$a$, T1$b$ and a linearization resistor R0$a$ and R0$b$ between each of first and second respective reference voltage generators R1$a$, R2$a$, ... Rk-1$a$, Rk$a$ and R1$b$, R2$b$, ... Rk-1$b$, Rk$b$ and a first supply potential V$_{CC}$; and FIG. 3 is a circuit diagram of a special exemplary embodiment of a circuit according to FIG. 2, having further cascode stages formed of fifth and sixth transistors T2$a$, T2$b$, which are respectively connected between the collector terminal or connection of a first transistor T$a$ and the first reference voltage generator R1$a$, R2$a$ as well as between the collector terminal or connection of a second transistor T$b$ and the second reference voltage generator R1$b$, R2$b$, a reference potential RV2 being applied to the base terminal or connection of the fifth transistor T2$a$ and to the base terminal or connection of the sixth transistor T2$b$, and a reference potential VR1 being applied to the base terminals or connections of the third transistor T1$a$ and of the fourth transistor T1$b$ forming the cascode stages already shown in FIG. 2.

Referring now to the figures of the drawing in detail and first, particularly, to FIG. 1 thereof, there is seen an analog-digital converter having the first and the second reference voltage generators. Each of the two reference voltage generators contains a series circuit of the resistors R1$a$, R2$a$, ... Rk-1$a$, Rk$a$, R1$b$, R2$b$, ... Rk-1$b$, Rk$b$, on which a controlled current is impressed in each case. These currents define the output potentials of the reference voltage generators in conjunction with the resistance values. Comparators each having two mutually balanced inputs, are additionally provided. The inputs of the comparators are connected to circuit nodes of the reference voltage generators and it is noted, for the sake of clarity, that the lines connected between the one inputs of the comparators and the circuit nodes of the second reference voltage generator are not interconnected. A first comparator K1 has one input connected to a circuit node of the second reference voltage generator R1$b$, R2$b$, ... Rk-1$b$, Rk$b$, which is provided for preparing the lowest reference level, and another input connected to a circuit node of the first reference voltage generator R1$a$, R2$a$, ... Rk-1$a$, Rk$a$, which is provided for preparing the highest reference level. A second comparator K2 has one input connected to the circuit node of the second reference voltage generator which is provided for preparing the second lowest reference level, and its other input is connected to the circuit node of the first reference voltage generator which is provided for preparing the second highest reference level. The inputs of further comparators ..., Kk-1, Kk are correspondingly connected to the first and to the second reference voltage generators, in such a way that one input of the last comparator Kk is connected to the circuit node of the second reference voltage generator which is provided for preparing the highest reference level, and its other input is connected to the circuit node of the first reference voltage generator which is provided for preparing the lowest reference level. In this case, a circuit node of the first reference voltage generator which is provided for preparing a reference level, is unambiguously allocated or definitely assigned to the one input of each comparator K1, K2, ..., and a circuit node of the second reference voltage generator which is provided for preparing a reference level is unambiguously allocated or definitely assigned to the other input of the comparator K1, K2, ...

The first reference voltage generator R1$a$, R2$a$, ... Rk-1$a$, Rk$a$. is located in the collector circuit of the first transistor T$a$. To this end, one terminal or connection of a series circuit of the resistors R1$a$, R2$a$, ... Rk-1$a$, Rk$a$ forming the first reference voltage generator is connected to the collector terminal or connection of the first transistor T$a$ and the other terminal or connection of this series circuit is connected to the first supply potential V$_{CC}$. The second reference voltage generator R1$b$, R2$b$, ... Rk-1$b$, Rk$b$—is located in the collector circuit of the second transistor T$b$ in the same manner. The first and second transistors T$a$, T$b$ form a differential amplifier circuit, and the control input of the first transistor T$a$ and the control input of the second transistor T$b$ form a balanced analog signal input to which push-pull signals $\Delta V_i$ can be applied. The emitter terminal or connection of the first transistor T$a$ is connected through a resistor RE$a$, which is used for negative feedback and is not significant to the invention, to a terminal or connection of a current source IE, and the emitter terminal or connection of the second transistor T$b$ is likewise connected through a further resistor REb to a terminal or connection of the current source IE. The current source IE has other terminal or connection that is connected to a second reference potential $V_{EE}$.

FIG. 2 shows an A/D converter which differs from that shown in FIG. 1 in that one of the linearization resistors R0a, R0b is provided in each of the first and second reference voltage generators. The series circuits of the reference resistors R1a, R2a, ... Rk-1a, Rka and R1b, R2b, ... Rk-1b, Rkb are connected through the resistors R0a, R0b to the first supply potential $V_{CC}$. Additionally, FIG. 2 differs in that the first reference voltage generator is connected through the control path or controllable junction of the third transistor T1a to the first supply potential $V_{CC}$, and the second reference voltage generator is connected through the control path or controllable junction of the fourth transistor T1b to the first supply potential $V_{CC}$. Another difference is that a constant potential VR is applied to the control input of the third transistor T1a and to the control input of the fourth transistor T1b.

The differential amplifier, which is formed by the first transistor Ta and the second transistor Tb in FIG. 1, with the current source IE in the emitter circuit and the two respective reference voltage generators R1a, R2a, ... Rk-1a, Rka, and R1b, R2b, ... Rk1-b, Rkb, has k balanced outputs at output voltages $\Delta$Vo,1, $\Delta$Vo,2, ..., $\Delta$Vo,k. In this case, the number k is determined by the number of resistance segments R1a, R2a, ... Rka of the reference voltage generators and by the corresponding number of comparators K1, K2, ..., Kk.

If the analog-digital converter is intended to have a resolution of n bits, with n being a natural number, then the number of resistors per reference voltage generator and the number of comparators are functions of the switching threshold of the comparators. If a switching threshold is intended to be in the center of the range, then $2^n-1$ resistors, which are normally of the same size, and identical comparators, are necessary. For example, if a switching threshold is intended to be balanced with respect to the center of the range, then $2^n$ resistors per reference voltage generator and as well as comparators are necessary, wherein $2^n-1$ resistors should be of equal size and the respective resistor R1a or R1b should be less than the other resistance segments, for example half as large.

If A is the gain factor of the transistor circuit formed by the first transistor Ta and by the second transistor Tb, and the resistors R1a, R2a, ... Rk-1a, Rka, and R1b, R2b, ... Rk-1b, Rkb are of equal size and have a value R, and if $\Delta V_i$ corresponds to the input differential voltage on the signal input of the circuit, and IE corresponds to the current flowing through the current source IE, then the following results for the individual differential voltages $\Delta$Vo,1, $\Delta$Vo,2, ..., $\Delta$Vo,k on the respective comparator inputs for $x=1$ to k:

$$\Delta Vo, x = A.\Delta V_i + (x-k/2).R.IE$$

Each voltage $\Delta$Vo,x tends to zero for a specific value of $\Delta V_i$. The switching threshold of a comparator Kx corresponds to the value of the voltage $\Delta V_i$, at which its input differential voltage $\Delta$Vo,x tends to zero. In this case, the voltage difference LSB between two adjacent switching thresholds is given by LSB=R.IE/A.

Between the output terminals of the differential amplifier circuit connected to a comparator, the same number of resistance segments of the reference voltage generator act for each pair of output terminals in the collector circuit of the differential amplifier. In consequence, the gain factor for the differential amplifier circuit and the voltage difference between two adjacent switching thresholds LSB can be adjusted independently of one another by selection of the resistance values and of the current of the current source IE.

In a particularly advantageous embodiment of the invention, the gain factor is selected to be A=1. In this way, the gain factor can be kept constant with sufficient accuracy over the entire control range. Interference due to non-linear deviations of the base-emitter voltages of the first transistor Ta and of the second transistor Tb can thus be kept within limits. With a number of resistors per reference voltage generator of $2^n-1$ and all of the resistors being of the same size, the linearization resistors R0a and R0b having the value R0 and the respective emitter resistors REa and REb having the value RE, a gain factor of A=1 can be set by means of:

$$2RE = 2^n.R + 2.R0.$$

With $2^n$ resistors per reference voltage generator, and the value of the resistor R1a and of the resistor R1b being half as large as the value of the other resistors of the reference voltage generators, the same relationship applies.

As a result of the intermediate connection of additional resistors (linearization resistors) R0a, R0b between the reference voltage generators and the first supply potential $V_{CC}$, it is possible to ensure that the differential amplifier circuit has a linear transmission characteristic over the complete control range.

The independence of the circuit configuration from supply voltage fluctuations, which is primarily achieved by a balanced signal flow, is further improved by means of the cascode stage being formed of the third transistor T1a and the fourth transistor T1b, to the base terminals or connections of which respective fixed potentials VR and VR1 are jointly applied, the collector terminals or connections of which are connected to the first supply potential $V_{CC}$, and the emitter terminals or connections of which in each case provide one potential of a reference voltage generator. In addition, such a cascode stage is used for linearization of the gain and, in addition, it is possible to set the DC level for the comparators. In particular, VR=$V_{CC}$ can be selected. In the case of circuit configurations according to FIG. 1 with a balanced construction, the gain is non-linear, inter alia, because the base-emitter voltages of the transistor Ta and of the transistor Tb are a function of the current flowing through the transistors. When the transistors Ta and Tb are driven with a differential signal $\Delta V_i$, currents of different magnitude flow in the two transistors, the difference between the currents is proportional to the differential signal $\Delta V_i$, and different base-emitter voltages are obtained in the transistors Ta and Tb. If, as is shown in FIG. 2, an additional cascode stage T1a and T1b is inserted, the same current flows through the transistors of this cascode stage as through the respective transistors Ta or Tb, so that this is the effect [lacuna] on the two output connection terminals of the resistor series circuits being formed of the resistors R1a, R2a, ... Rk-1a, Rka and possibly R0a, and of the resistors R1b, R2b, ... Rk-1b, Rkb, and possibly R0b respectively, and so that the non-linearity caused thereby is largely suppressed.

Such a circuit according to the invention loads the input signal source considerably less than known circuit configurations. The input capacitance is significantly lower and much more linear than in the case of known circuit configurations. In addition, amplification of the analog signal is possible. Furthermore, an analog signal amplifier can also be connected upstream without its DC voltage offset influencing the quality of the analog-digital conversion.

In a particularly favorable embodiment shown in FIG. 3, the fifth transistor T2a is connected between the collector terminal or connection of the first transistor Ta and the first reference voltage generator R1a, R2a, . . . Rk-1a, Rka, and the sixth transistor T2b is connected between the collector terminal or connection of the second transistor Tb and the second reference voltage generator R1b, R2b, . . . Rk-1b, Rkb, the further reference potential VR2 is applied to the base terminal or connection of the fifth transistor and to the base terminal or connection of the sixth transistor. The input capacitance of the differential amplifier circuit that is formed of the first and the second transistors Ta and Tb, is reduced by this additional cascode stage. In consequence, the circuit is also still suitable for analog signals having a relatively high frequency.

The undesired effects which result from the input base currents of the comparator circuit and relate to the input analog voltage, have a linear response in the case of circuits according to the invention, while they have a second-order response along the comparator array in the case of circuits according to the prior art.

Any comparators having a balanced input can be used as the comparators K1, K2, . . . , Kk, for example those which are shown in an article entitled "A 6-Bit/200 MHz Full Nyquist A/D Converter" by Zojer, Petschacher and Luschnig, in The IEEE Journal of Solid-state Circuits, Vol. sc-20, No. 3, June 1985, pages 780 to 786, in particular in FIG. 4 on page 782.

A special feature of circuit configurations according to the invention can be seen in that, inter alia, two reference voltages are varied relative to one another as a function of an analog signal.

We claim:

1. An analog-digital converter, comprising:
first and second reference voltage generators each including a series circuit of resistors, each of said reference voltage generators having a circuit node for preparing a lowest reference level, a circuit node for preparing a highest reference level, a circuit node for preparing a second lowest reference level, and a circuit node for preparing a second highest reference level,
first, second, at least one further and last comparators each preparing an output signal as a function of an associated reference voltage and of an analog signal to be converted, said comparators each having two mutually balanced inputs,
one input of said first comparator being connected to the circuit node of said second reference voltage generator for preparing the lowest reference level, and the other input of said first comparator being connected to the circuit node of said first reference voltage generator for preparing the highest reference level,
one input of said second comparator being connected to the circuit node of said second reference voltage generator for preparing the second lowest reference level, and the other input of said second comparator being connected to the circuit node of said first reference voltage generator for preparing the second highest reference level,
said at least one further comparator being connected to the circuit node of said second reference voltage generator for preparing the second highest reference level, and the other input of said at least one further comparator being connected to the circuit node of said first reference voltage generator for preparing the second lowest reference level,
one input of said last comparator being connected to the circuit node of said second reference voltage generator for preparing the highest reference level, and the other input of said last comparator being connected to the circuit node of said first reference voltage generator for preparing the lowest reference level,
whereby the circuit nodes of said first and second reference voltage generators are unambiguously allocated to specific inputs of said comparators,
a differential amplifier circuit having first and second transistors with control inputs, collector terminals and collector circuits, said first reference voltage generator being connected in the collector circuit of said first transistor, and said second reference voltage generator being connected in the collector circuit of said second transistor,
said series circuit of resistors of said first reference voltage generator having one terminal connected to the collector terminal of said first transistor and another terminal connected to a supply potential, and said series circuit of resistors of said second reference voltage generator having one terminal connected to the collector terminal of said second transistor and another terminal connected to the supply potential, and
the control input of said first transistor and the control input of said second transistor forming a balanced signal input to which push-pull signals are to be applied.

2. The A/D converter according to claim 1, wherein said first and second reference voltage generators each have a linearization resistor connecting a respective one of said series circuits of resistors to the supply potential.

3. The A/D converter according to claim 2, including third and fourth transistors each having a control path and each having a control input for receiving a constant potential, said first reference voltage generator being connected through the control path of said third transistor to the supply potential, and said second voltage generator being connected through the control path of said fourth transistor to the supply potential.

4. The A/D converter according to claim 3, wherein said first and second transistors have emitter terminals, and including another series circuit connected between the emitter terminals of said first and second transistors, said other series circuit having two emitter resistors and another circuit node therebetween, a current source connected between the other circuit node and another supply potential, and said emitter resistors having values selected as a function of the number and the value of said resistors of said series circuits of said reference voltage generators and of the value of said linearization resistors, for setting a gain factor of unity.

5. The A/D converter according to claim 1, including third and fourth transistors each having a control path and each having a control input for receiving a constant potential, said first reference voltage generator being connected through the control path of said third transistor to the supply potential, and said second voltage generator being connected through the control path of said fourth transistor to the supply potential.

6. The A/D converter according to claim 5, wherein said first and second transistors have emitter terminals, and including another series circuit connected between the emitter terminals of said first and second transistors, said other series circuit having two emitter resistors and another circuit node therebetween, a current source connected between the other circuit node and another supply potential, and said emitter resistors having values selected as a function of the number and the value of said resistors of said series circuits of said reference voltage generators and of the value of said linearization resistors, for setting a gain factor of unity.

* * * * *